(12) United States Patent
Keeney et al.

(10) Patent No.: US 6,894,585 B2
(45) Date of Patent: May 17, 2005

(54) HIGH QUALITY FACTOR (Q) PLANAR SPIRAL INDUCTOR BASED CATV DIPLEXER AND TELEPHONY MODULE

(75) Inventors: Bill Allen Keeney, Ryland (IE);
Deirdre Anne Wallace, Passage West (IE)

(73) Assignee: M/A-Com, Inc., Lowell, MA (US)

( * ) Notice: Subject to any disclaimer, the term of this patent is extended or adjusted under 35 U.S.C. 154(b) by 120 days.

(21) Appl. No.: 10/113,660

(22) Filed: Mar. 29, 2002

(65) Prior Publication Data

US 2003/0186674 A1 Oct. 2, 2003

(51) Int. Cl.[7] ................................................ H03H 7/00
(52) U.S. Cl. ........................ 333/132; 333/167; 333/185; 336/200
(58) Field of Search ................................. 333/132, 167, 333/193, 185, 184, 180, 200, 199

(56) References Cited

U.S. PATENT DOCUMENTS

| | | | |
|---|---|---|---|
| 6,175,727 B1 * | 1/2001 | Mostov ....................... 455/307 |
| 6,285,865 B1 | 9/2001 | Vorenkamp et al. ........ 455/307 |
| 6,295,554 B1 | 9/2001 | Karadogan et al. ......... 709/219 |
| 6,380,608 B1 * | 4/2002 | Bentley ....................... 257/531 |
| 6,590,473 B1 * | 7/2003 | Seo et al. .................... 333/185 |

* cited by examiner

*Primary Examiner*—Robert Pascal
*Assistant Examiner*—Kimberly Glenn

(57) ABSTRACT

A cable television diplexer and telephony module that can be employed in CATV data transmission systems to enhance performance levels and reduce manufacturing costs. The cable television diplexer and telephony module includes a printed circuit board substrate, and a diplexer having a low pass filter section and a high pass filter section, each of which has components mounted on the substrate. The respective low pass and high pass filter sections of the diplexer include one or more high Q value planar spiral inductors. Each spiral inductor includes a narrow track of metal disposed on the substrate and wound around a center to form a circular spiral curve having a plurality of turns. The spiral inductor may be fabricated on the substrate of the cable television diplexer and telephony module, or on a separate substrate, using a standard PCB fabrication process.

12 Claims, 4 Drawing Sheets

HIGH QUALITY FACTOR (Q) PLANAR SPIRAL INDUCTOR BASED CATV DIPLEXER AND TELEPHONY MODULE

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates generally to CAble TeleVision (CATV) data transmission systems, and more specifically to CATV data transmission systems that include high performance CATV diplexers and telephony modules.

CAble TeleVision (CATV) system networks have been widely deployed for distributing Radio Frequency (RF) television channels to homes of subscribers. More recently, CATV system networks have been employed in CATV data transmission systems for providing interactive data services to subscriber homes. A conventional CATV data transmission system includes a headend for receiving RF signals carried by a CATV network, a distribution system for receiving a broadband signal comprising the RF signals from the headend, and a plurality of subscriber drop cables for receiving respective portions of the broadband power from the distribution system. Each drop cable provides the broadband signal directly to subscriber equipment, which may comprise a suitable set top converter, a TV unit, or a Personal Computer (PC).

In a CATV data transmission system configured to provide interactive data services, a cable modem such as an Internet Protocol (IP) telephony based cable modem is typically disposed at a subscriber end of the CATV network. The cable modem typically comprises a CATV Input/Output (I/O) telephony module including an RF/telephony interface, which is configured to connect to the CATV network, receive data over the CATV network, and provide the received data to the subscriber equipment. In this way, the cable modem establishes a downstream data connection over a forward path from the CATV network to the subscriber. The RF/telephony interface is further configured to connect to the CATV network, receive data provided by the subscriber equipment, and transmit the received data over the CATV network. In this way, the cable modem establishes an upstream data connection over a return path from the subscriber to the CATV network.

The typical CATV I/O telephony module further includes at least one diplex filter ("diplexer") configured to isolate the frequency of the downstream data from the frequency of the upstream data to assure that the downstream data signals and the upstream data signals do not interfere with each other. The diplexer generally includes a low pass filter section in the return path and a high pass filter section in the forward path, each of which may include one or more inductors such as a torroidal inductor.

One shortcoming of the typical CATV I/O telephony module is that the torroidal inductor(s) included in the diplexer is a relatively high cost component. For example, torroidal inductors are typically fabricated by manually wrapping wires around ferromagnetic cores. Although such a fabrication process can be used to make torroidal inductors with high Q values, the fabrication process is generally complicated and labor intensive and can lead to high manufacturing costs. Moreover, the high cost torroidal inductors can significantly increase the overall cost of the CATV I/O telephony module.

It would therefore be desirable to have a high performance CATV diplexer and telephony module that can be employed in CATV data transmission systems. Such a CATV diplexer and telephony module would be configured to achieve a high level of performance while having a low cost of manufacture.

BRIEF SUMMARY OF THE INVENTION

In accordance with the present invention, a CAble TeleVision (CATV) diplex filter ("diplexer") and telephony module is provided that can be employed in CATV data transmission systems to enhance performance levels and reduce manufacturing costs. Benefits of the presently disclosed CATV diplexer and telephony module are achieved by incorporating one or more high Quality factor (Q) value planar spiral inductors in the diplexer circuitry.

In one embodiment, a CATV Input/Output (I/O) telephony module includes at least one double-sided Printed Circuit Board (PCB) substrate, and a diplexer having a low pass filter section and a high pass filter section, each of which has components mounted on at least one side of the PCB substrate. The respective low pass and high pass filter sections of the diplexer include one or more high Q value planar spiral inductors configured to reduce noise in the CATV data transmission system and enhance the selectivity of the filters. In another embodiment, a standalone diplexer includes at least one double-sided PCB substrate, and low pass and high pass filter sections having components mounted on at least one side of the PCB substrate, in which the respective low pass and high pass filter sections include one or more high Q value planar spiral inductors.

In the presently disclosed embodiment, the high Q value planar spiral inductor comprises a narrow track of metal disposed on at least a first side of a substrate and wound around a center to form a circular spiral curve having a plurality of turns. The winding of the spiral inductor has a predetermined inner radius, and a predetermined inner radius-to-outer radius ratio. The end of the winding disposed within the inner radius of the spiral inductor is accessible from the opposite side of the substrate by a via disposed at the approximate center of the spiral inductor.

The high Q value planar spiral inductor may be fabricated on the respective double-sided PCB substrates of the CATV I/O telephony module and the standalone diplexer. The spiral inductor may be fabricated on a single surface of the PCB substrate to form a single-sided spiral inductor, or portions of the spiral inductor may be fabricated on opposing surfaces of the PCB substrate to form a double-sided spiral having a more compact configuration. Alternatively, the spiral inductor may be fabricated on a separate substrate, punched-out of the separate substrate, placed on the respective PCB substrates of the CATV diplexer and telephone modules, and soldered into place. In a preferred embodiment, the high Q value planar spiral inductor is monolithically implemented on a PCB substrate using a standard PCB fabrication process.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which:

FIG. 2a is a plan view of a plurality of spiral inductors fabricated on a substrate separate from the CATV I/O telephony module of FIG. 1a;

FIG. 2b is a detail view of one of the plurality of spiral inductors of FIG. 2a;

FIG. 4 is a flow diagram of a method of fabricating the CATV I/O telephony module of FIG. 1a.

DETAILED DESCRIPTION OF THE INVENTION

A CAble TeleVision (CATV) diplex filter ("diplexer") and telephony module is disclosed that can be employed in a CATV data transmission system to enhance performance levels and reduce manufacturing costs. In the presently disclosed CATV diplexer and telephony module, one or more high Quality factor (Q) value planar spiral inductors are incorporated in the diplexer circuitry to reduce noise floors, reduce phase noise, and increase filter selectivity. Further, the high performance spiral inductors can be fabricated using a standard Printed Circuit Board (PCB) fabrication process.

Figure 1A:
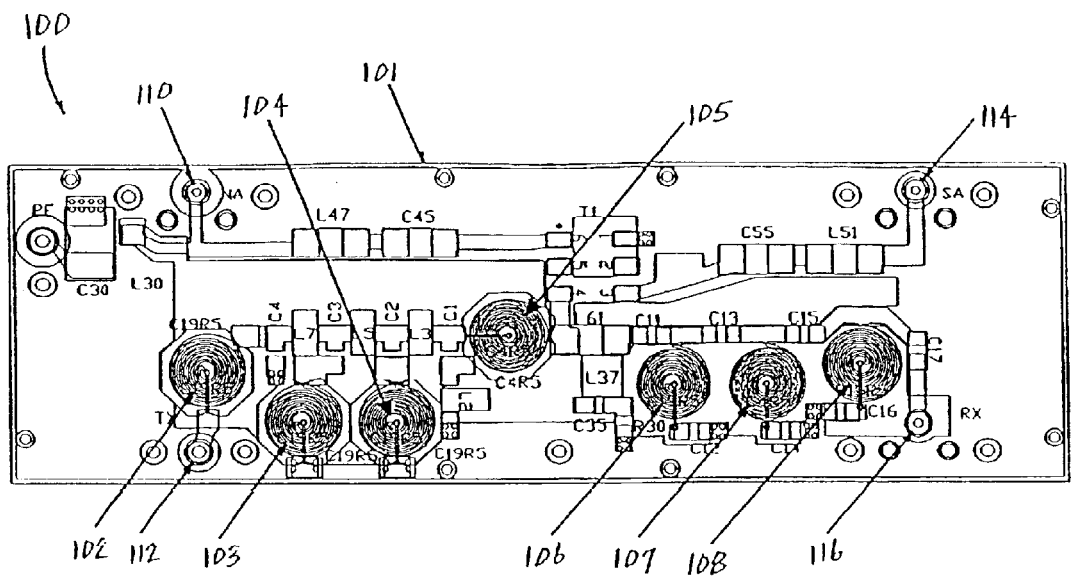
FIG. 1a is a plan view of a CATV I/O telephony module including a plurality of spiral inductors according to the present invention.
Figure 1B:
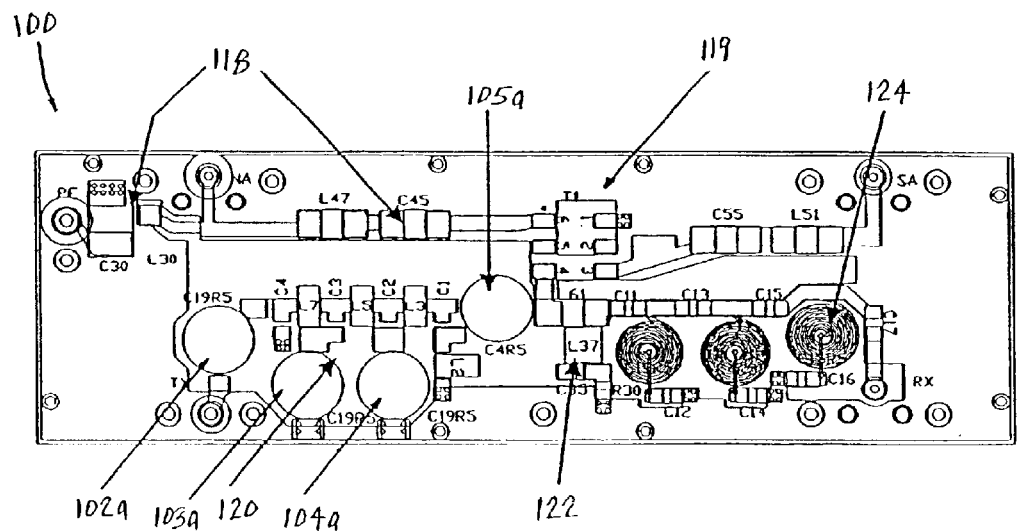
FIG. 1b is a plan view of the CATV I/O telephony module of FIG. 1a in which a portion of the plurality of spiral inductors is omitted.

FIGS. 1a–1b depict an illustrative embodiment of a CATV Input/Output (I/O) telephony module 100, in accordance with the present invention. In the illustrated embodiment, the CATV I/O telephony module 100 comprises a double-sided PCB substrate 101, a broadband power extraction circuit (shown generally at reference numeral 118), a power divider circuit (shown generally at reference numeral 119), a crossover matching circuit (shown generally at reference numeral 122), and a diplexer including a low pass filter (shown generally at reference numeral 120) and a high pass filter (shown generally at reference numeral 124), each of which is mounted on a surface of the PCB substrate 101. The CATV I/O telephony module 100 further includes first and second network ports 110 and 114 configured to connect to a broadband data network such as a CATV system network, and transmit and receive ports 112 and 116 configured to connect to subscriber equipment such as a suitable set top converter, a TV unit, or a Personal Computer (PC).

It should be appreciated that the CATV I/O telephony module 100 may be employed in a CATV data transmission system that includes a CATV network, a headend for receiving Radio Frequency (RF) signals carried by the CATV network (e.g., from a satellite, a broadcast network, or another CATV network), a distribution system for receiving a broadband signal comprising the RF signals from the headend, and a plurality of subscriber drop cables for receiving respective portions of the broadband power from the distribution system. Further, the CATV I/O telephony module 100 may be incorporated in a cable modem such as an Internet Protocol (IP) telephony based cable modem disposed at a subscriber end of the CATV network. The CATV I/O telephony module 100 is configured to receive data included in the broadband signal by a downstream data connection established over a forward path from the CATV network to the subscriber equipment. Because the CATV data transmission system may be configured to provide interactive data services such as home shopping, Internet access, and movies on-demand to subscriber homes, the CATV I/O telephony module 100 may be further configured to transmit data by an upstream data connection established over a return path from the subscriber equipment to the CATV network. It is understood, however, that the CATV I/O telephony module 100 may alternatively be configured to operate in a traditional one-way CATV system network.

The diplexer including the low pass filter 120 in the return path and the high pass filter 124 in the forward path is configured to isolate the frequency of the downstream data from the frequency of the upstream data to assure that the downstream and upstream data signals do not interfere with each other. It is noted that the crossover matching circuit 122 reduces return loss in the diplexing region of the CATV I/O telephony module 100. It should be appreciated that the CATV I/O telephony module 100 may alternatively comprise a triplex filter ("triplexer") including a low pass filter section, a high pass filter section, and a band-pass filter section, or any other suitable filter circuitry.

As shown in FIGS. 1a–1b, the power extraction circuit 118 includes capacitor components C30, C45, and C55, and an inductor component L30; the power divider circuit 119 includes a transformer component T1; the low pass filter 120 includes discrete capacitor components C1–C4 and inductor components L2–L3, L5, and L7, and high Q value planar spiral inductors 102-105; the crossover matching circuit 122 includes inductor components L47 and L51, and serially connected capacitor, inductor, and resistor components C35, L37, and R30; and, the high pass filter 124 includes discrete capacitor components C11–C16, and high Q value planar spiral inductors 106–108. In the illustrated embodiment, the respective components of the power extraction circuit 118, the power divider circuit 119, the low pass filter 120, the crossover matching circuit 122, and the high pass filter 124 are mounted on a first surface of the double-sided PCB substrate 101.

As mentioned above, the high Q values of the planar spiral inductors 102–108 incorporated in the diplexer circuitry of the CATV I/O telephony module 100 operate to reduce noise, increase filter selectivity, and reduce insertion loss at the low pass filter and/or high pass filter's band edge when high stop band attenuation is required. It is noted that each of the spiral inductors 102–108 may be fabricated on a single surface of the double-sided PCB substrate 101, on opposing surfaces of the PCB substrate 101, or alternatively, on a separate PCB substrate.

Figure 2A:
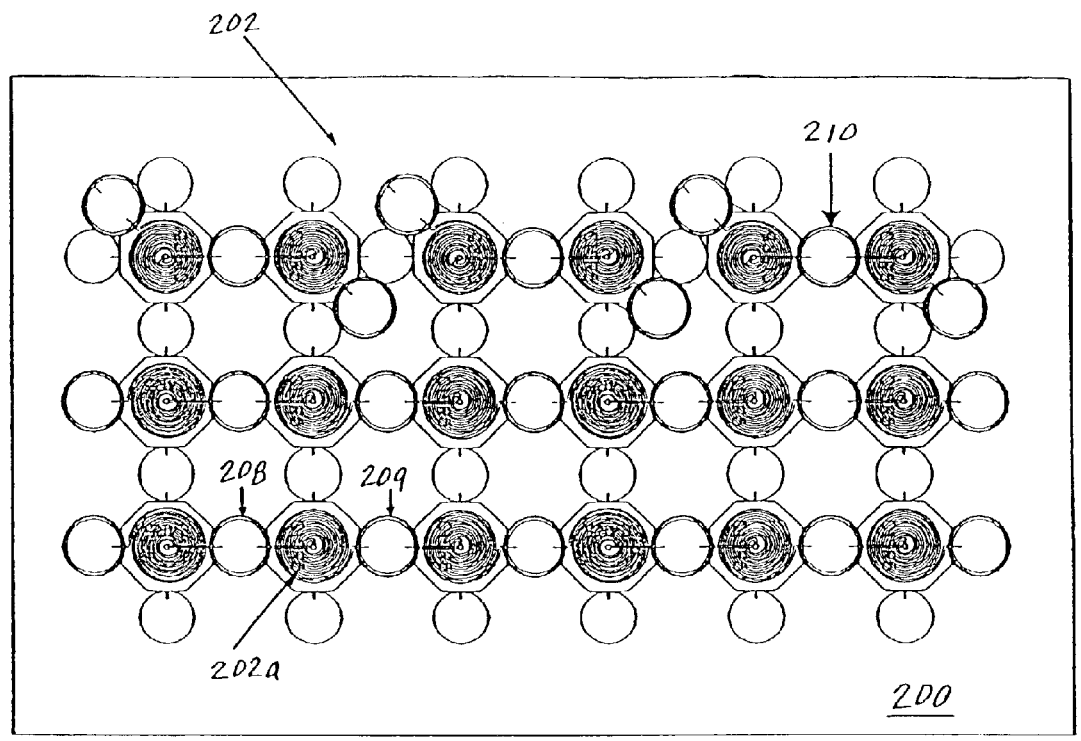

FIG. 2a depicts an illustrative embodiment of a plurality of high Q value planar spiral inductors 202 fabricated on a surface of a double-sided PCB substrate 200, which is separate from the CATV I/O telephony module 100 (see FIGS. 1a–1b). It is noted that the spiral inductors 202 may be fabricated on the separate PCB substrate 200 because the RF properties of the substrate 200 are better than that of the main PCB substrate 101. For example, the RF substrate 200 may comprise an RO4003 ROGERS™ RF substrate or any other suitable RF substrate.

In the presently disclosed embodiment, although certain ones of the planar spiral inductors 202 may be disposed on the substrate surface in different orientations, the spiral inductors 202 are otherwise identical. Further, adjacent ones of the spiral inductors 202 are connected by shared conductive vias such as vias 208–210.

Figure 2B:
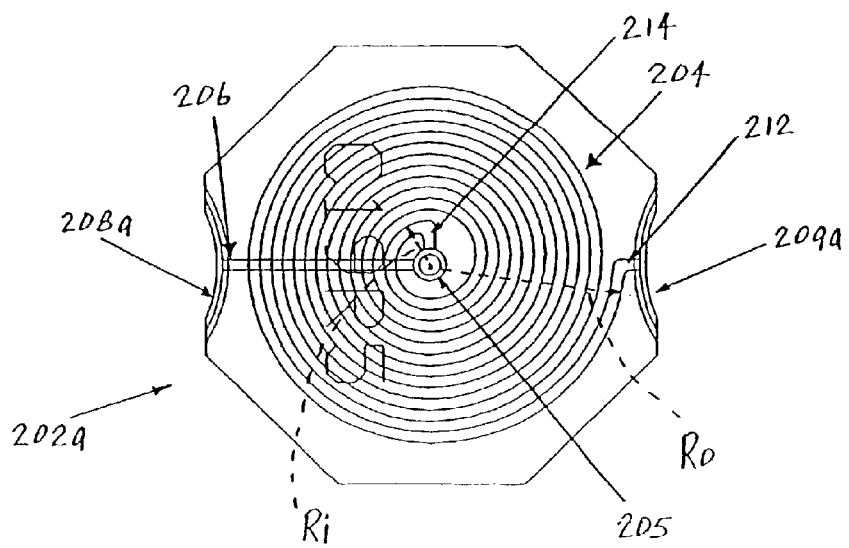

FIG. 2b depicts an illustrative embodiment of a planar spiral inductor 202a included in the plurality of spiral inductors 200 (see FIG. 2a). In the illustrated embodiment, the spiral inductor 202a is fabricated on the double-sided RF substrate 200 (see FIG. 2a) and subsequently punched-out of the substrate 200. Specifically, the spiral inductor 202a includes a narrow track of metal 204 disposed on the surface of a first side of the RF substrate 200. It is noted that the narrow metal track 204 may comprise a single metal track or multiple metal tracks. The spiral inductor 202a is wound around a center conductive via 205 to form a spiral curve having a plurality of turns. In a preferred embodiment, the spiral curve of the spiral inductor 202a is circular to reduce stray capacitance that may occur in a spiral having one or more corners (e.g., a conventional rectangular spiral inductor), thereby increasing the Self-Resonant Frequency (SRF) of the spiral inductor 202a.

For example, the circular spiral inductor 202a may have an inner radius Ri of about 0.627 mm, a track width of about 0.20 mm, a track thickness of about five times the skin depth, and an inner radius Ri to outer radius Ro ratio (Ri/Ro) of about 5.5, or any other suitable dimensions. It is noted that higher Q values can be achieved with larger area spiral inductors because the reactance $X_L$ to resistance $R_S$ ratio is greater for such spiral inductors (i.e., $Q=X_L/R_S$). Further, the track width and the gap width between adjacent turns of the spiral inductor 202a may be approximately the same.

As shown in FIG. 2b, an outer end 212 of the metal track 204 is connected to a portion 209a of the via 209, which is configured to allow access to the outer end 212 from either the above-mentioned first side of the double-sided RF substrate 200 or the opposite side of the RF substrate 200. Further, an inner end 214 of the metal track 204 is connected to the center via 205, which is configured to allow access to the inner end 214 from the opposite side of the RF substrate 200. In the illustrated embodiment, a narrow track of metal 206 disposed on the opposite side of the RF substrate 200 connects the center via 205 to a portion 208a of the outer via 208. Like the via portion 209a, the via portion 208a is configured to allow access to the metal track 206 (which is connected to the inner end 214 of the spiral inductor 202a by the center via 205) from either the above-mentioned first side of the double-sided RF substrate 200 or the opposite side of the RF substrate 200. Moreover, the via portions 208a and 209a are configured to provide relatively large solder contact areas to reduce resistance and thus maintain the high Q value of the spiral inductor 202a.

As described above, the planar spiral inductors 102–108 may be fabricated on the main PCB substrate 101 (see FIG. 1a) or on the separate RF substrate 200 (see FIG. 2a). In the presently disclosed embodiment, the spiral inductors 102–105 of the low pass filter 120 are fabricated on the separate RF substrate 200, and the spiral inductors 106–108 of the high pass filter 124 are fabricated on the main PCB substrate 101.

As shown in FIG. 1b, a plurality of holes 102a–105a (see FIG. 1b) is formed through the main PCB substrate 101, and the spiral inductors 102–105 of the low pass filter 120 are fastened (e.g., soldered) into place on the PCB substrate 101 so that the respective inductors 102–105 are in registration with holes 102a–105a. In the illustrated embodiment, each of the holes 102a–105a has a radius approximately equal to the outer radius Ro of the spiral inductor 202a. By forming the holes 102a–105a through the PCB substrate 101, the parasitic capacitance between the spiral inductors 102–105 and the PCB substrate 101 can be reduced, thereby increasing the SRF of the inductors 102–105. The holes 102a–105a also reduce the dielectric loading of the PCB substrate 101, which, e.g., can affect the frequency response of the low pass filter 120.

Figure 3:
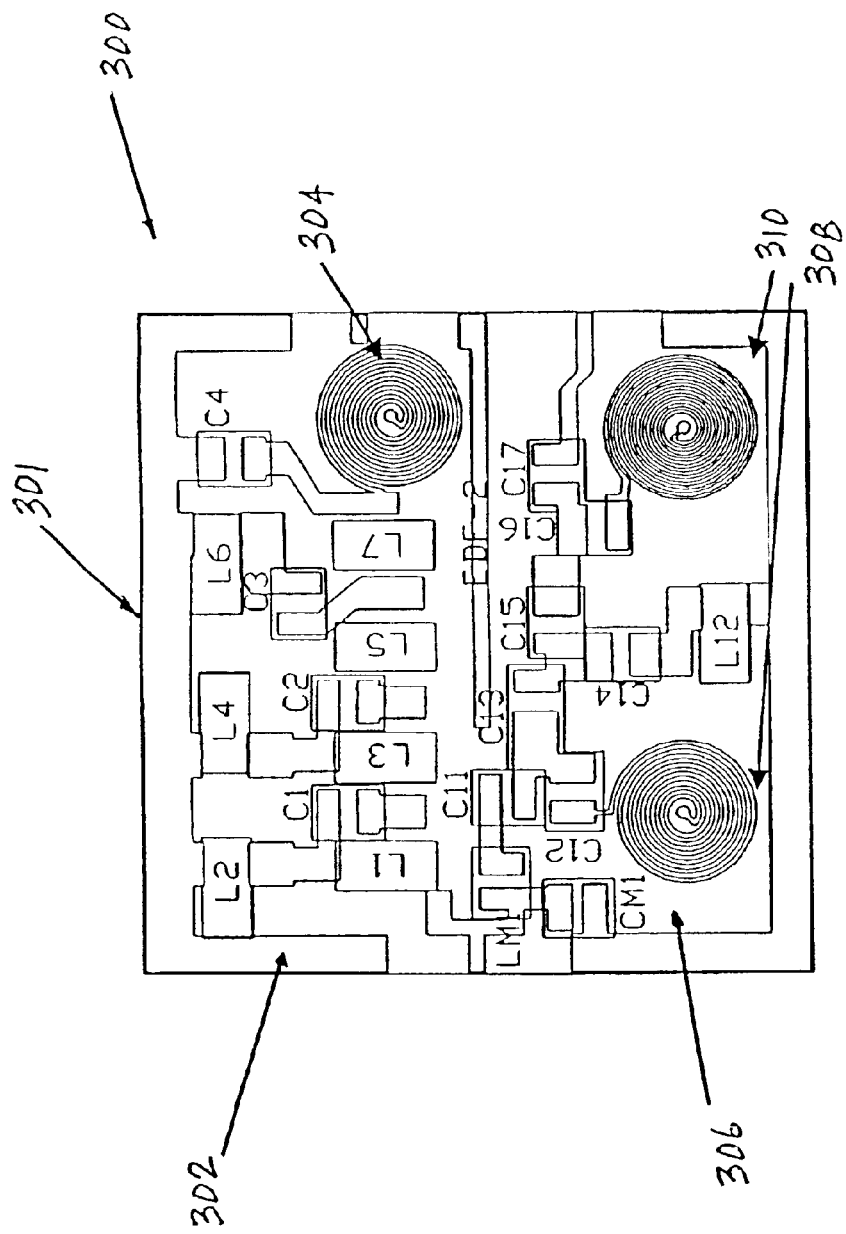
FIG. 3 is a plan view of a standalone diplexer including a plurality of spiral inductors according to the present invention.

FIG. 3 depicts an illustrative embodiment of a standalone diplexer 300, in accordance with the present invention. In the illustrated embodiment, the diplexer 300 comprises a double-sided PCB substrate 301, and a low pass filter (shown generally at reference numeral 302) and a high pass filter (shown generally at reference numeral 306), each of which is mounted on the PCB substrate 301. Like the diplexer included in the CATV I/O telephony module 100, the diplexer 300 may be employed in an interactive CATV data transmission system to isolate the frequency of downstream data provided over a network to subscriber equipment from the frequency of upstream data generated by the subscriber equipment for subsequent transmission over the same network or a different network. For example, the diplexer 300 may be used in a line amplifier of a distribution system included in the interactive CATV data transmission system.

As shown in FIG. 3, the low pass filter 302 includes discrete capacitor components C1–C4 and inductor components L1–L7, and a high Q value planar circular spiral inductor 304. Further, the high pass filter 306 includes discrete capacitor components C11–C17 and inductor component L12, and high Q value planar circular spiral inductors 308 and 310. In the illustrated embodiment, respective components of the low pass filter 302 and the high pass filter 306 are mounted on a first surface of the double-sided PCB substrate 301. It is understood, however, that the respective components of the low pass and high pass filters 302 and 306 may be mounted on one or both sides of the double-sided PCB substrate 301, and the circular spiral inductors 304, 308, and 310 may comprise single and/or double-sided spirals.

Figure 4:
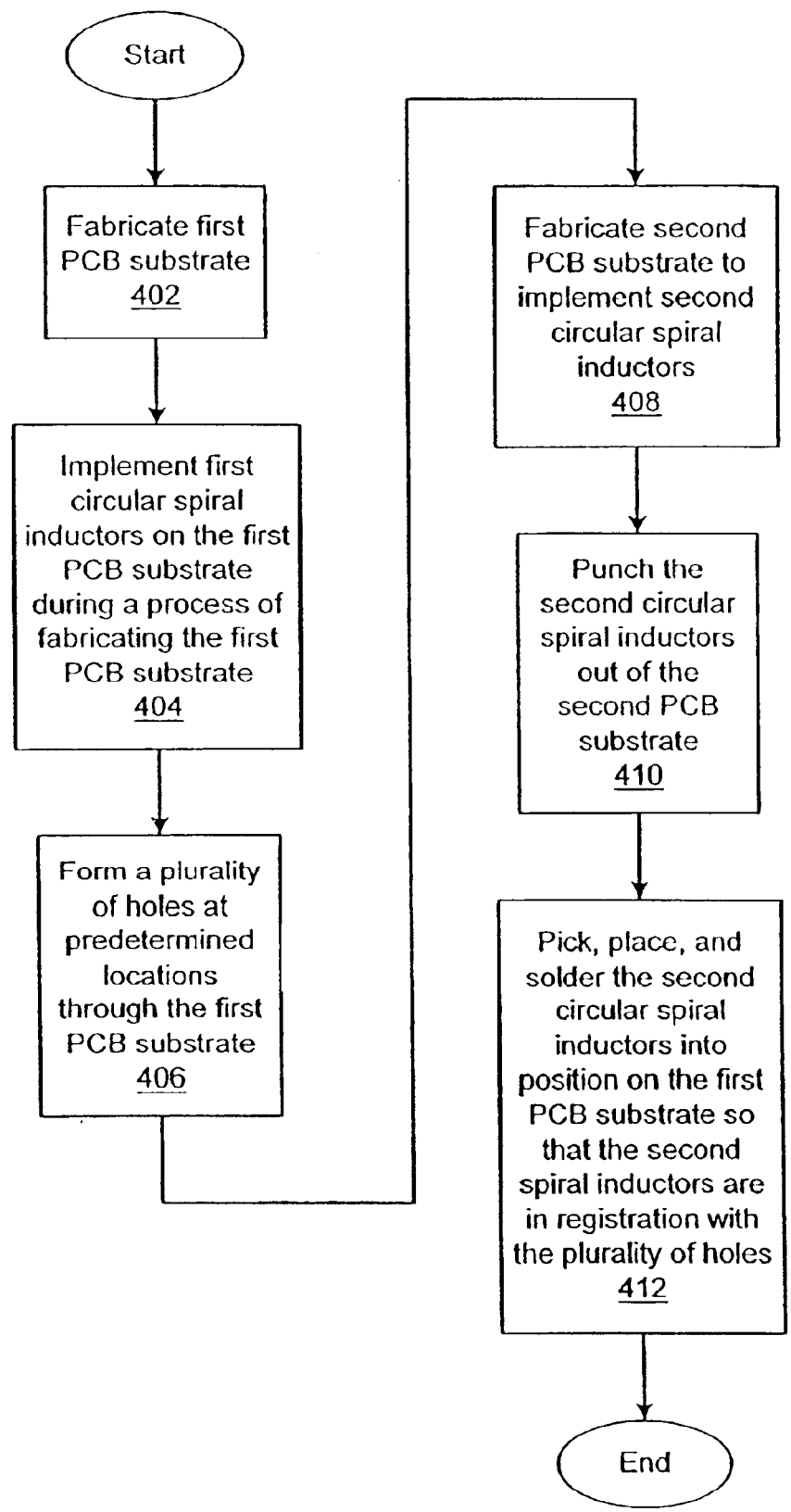

A method of fabricating the CATV diplexer and telephony module 100 including the plurality of circular spiral inductors 102–108 (see FIGS. 1a–1b) is illustrated by reference to FIG. 4. As depicted in step 402, a first PCB substrate is fabricated using a standard PCB fabrication process according to a predetermined layout for the CATV diplexer and telephony module. During the standard PCB fabrication process, one or more first circular spiral inductors (e.g., the spiral inductors 106–108) are implemented, as depicted in step 404, on the first PCB substrate. Next, a plurality of holes is formed, as depicted in step 406, at predetermined locations through the first PCB substrate using suitable PCB cutting equipment, each hole having a predetermined radius. A second PCB substrate is then fabricated, as depicted in step 408, to implement one or more second circular spiral inductors (e.g., the spiral inductors 102–105), each second spiral inductor having an outer radius Ro approximately equal to the radius of the holes formed in step 406. The second spiral inductors are then punched-out of the second PCB substrate, as depicted in step 410, using suitable PCB cutting equipment. Finally, the second circular spiral inductors and other discrete components of the CATV diplexer and telephony module are picked, placed, and soldered into position on the first PCB substrate, as depicted in step 412, either manually or automatically using suitable PCB pick-and-place and soldering equipment, so that the second spiral inductors are in registration with the plurality of holes.

It will further be appreciated by those of ordinary skill in the art that modifications to and variations of the above-described high Q value planar spiral inductor based CATV diplexer and telephony module may be made without departing from the inventive concepts disclosed herein. Accordingly, the invention should not be viewed as limited except as by the scope and spirit of the appended claims.

What is claimed is:

1. A radio frequency input/output module comprising:

a first printed circuit board; and filter circuitry disposed on the first printed circuit board and configured to receive at least one radio frequency input signal and transmit at least one radio frequency output signal, the filter circuitry including at least one high quality factor value inductor, the high quality factor value inductor comprising a planar spiral inductor fabricated using a standard printed circuit board fabrication process on a second printed circuit board separate from the first printed circuit board.

2. The radio frequency input/output module of claim 1 wherein the first printed circuit board includes at least one hole and the high quality factor value inductor is disposed on the first printed circuit board such that the inductor is in registration with the hole.

3. The radio frequency input/output module of claim 1 wherein the high quality factor value inductor includes at least one narrow track of metal disposed on at least one side of the first printed circuit board.

4. The radio frequency input/output module of claim 3 wherein the narrow track of metal of the inductor is wound around a center via to form a circular spiral curve having a plurality of turns.

5. The radio frequency input/output module of claim 4 wherein the track of metal is disposed on a first side of the first printed circuit board, the track of metal having an inner end connected to the center via, and wherein the center via is configured to allow electrical connection to the inner end of the metal track from a second side of the first printed circuit board.

6. The radio frequency input/output module of claim 5 wherein the track of metal further has an outer end, the outer end being connected to a second via, and wherein the second via is configured to allow electrical connection to the outer end of the metal track from the first side or the second side of the first printed circuit board.

7. The radio frequency input/output module of claim 1 wherein the second printed circuit board has a lower dielectric constant than the first printed circuit board.

8. A method of fabricating a radio frequency input/output module including one or more spiral inductors, comprising the steps of:

fabricating a first printed circuit board according to a predetermined layout of the radio frequency input/output module;

forming a plurality of holes at predetermined locations in the first printed circuit board, each hole having a predetermined radius;

fabricating a second printed circuit board to include at least one spiral inductor, each spiral inductor having an outer radius approximately equal to the hole radius;

separating the spiral inductor from the second printed circuit board; and positioning the spiral inductor on the first printed circuit board so that the spiral inductor is in registration with the respective hole formed in the first printed circuit board.

9. The method of claim 8 wherein the step of fabricating the printed circuit boards is performed using a standard printed circuit board fabrication process.

10. The method of claim 8 wherein the second printed circuit board has a lower dielectric constant than the first printed circuit board.

11. A radio frequency input/output module, comprising:

a first printed circuit board; and filter circuitry disposed on the first printed circuit board and configured to receive at least one radio frequency input signal and transmit at least one radio frequency output signal, the filter circuitry including a plurality of high quality factor value inductors, the plurality of high quality factor value inductors comprising a planar circular spiral inductor fabricated using a standard printed circuit board fabrication process, a first subset of the plurality of high quality factor value inductors fabricated on the first printed circuit board and a second subset of the plurality of high quality factor value inductors fabricated on a second printed circuit board and placed on the first printed circuit board.

12. A radio frequency input/output module of claim 11, wherein the first printed circuit board includes a plurality of holes for receiving the second subset of the plurality of high quality factor value inductors.

\* \* \* \* \*